US006542137B2

(12) United States Patent
Kimura et al.

(10) Patent No.: US 6,542,137 B2
(45) Date of Patent: *Apr. 1, 2003

(54) DISPLAY DEVICE

(75) Inventors: Mutsumi Kimura, Suwa (JP); Hiroshi Kiguchi, Suwa (JP)

(73) Assignee: Seiko Epson Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/077,072
(22) PCT Filed: Sep. 25, 1997
(86) PCT No.: PCT/JP97/03424
§ 371 (c)(1),
(2), (4) Date: May 18, 1998
(87) PCT Pub. No.: WO98/13811
PCT Pub. Date: Apr. 2, 1998

(65) Prior Publication Data
US 2001/0054991 A1 Dec. 27, 2001

(30) Foreign Application Priority Data
Sep. 26, 1996 (JP) .............................................. 8-255191

(51) Int. Cl.⁷ ................................................. G09G 3/30
(52) U.S. Cl. ............................. 345/76; 438/29; 345/92
(58) Field of Search .............................. 345/92, 90, 93, 345/76, 48, 94–98, 205, 206; 349/42, 48; 438/29

(56) References Cited

U.S. PATENT DOCUMENTS

| | | | |
|---|---|---|---|
| 4,006,383 A | * | 2/1977 | Luo et al. .................. 315/169 |
| 4,523,189 A | * | 6/1985 | Takahara et al. ............. 340/781 |
| 4,623,908 A | * | 11/1986 | Oshima et al. ............. 357/23.7 |
| 5,439,837 A | * | 8/1995 | Hata et al. ................... 438/151 |
| 5,506,598 A | * | 4/1996 | Shimada et al. ............... 345/92 |
| 5,550,066 A | * | 8/1996 | Tang et al. .................... 437/40 |
| 5,684,365 A | * | 11/1997 | Tang et al. ............... 315/169.3 |
| 5,903,249 A | * | 5/1999 | Koyama et al. ............... 345/92 |
| 6,277,679 B1 | * | 8/2001 | Ohtani ........................ 438/151 |

FOREIGN PATENT DOCUMENTS

| | | | |
|---|---|---|---|
| JP | A-60-33593 | | 2/1985 |
| JP | 4-362616 | * | 12/1992 |
| JP | 08116067 | * | 7/1996 |

OTHER PUBLICATIONS

Luo, Fang Chen; *Design and Fabrication of Large–Area Thin Film Transistor Matrix Circuits for Flat Display Panels*; Jan. 1980, pp. 26–32.

* cited by examiner

Primary Examiner—Richard Hjerpe
Assistant Examiner—Kevin M. Nguyen
(74) Attorney, Agent, or Firm—Oliff & Berridge, PLC

(57) ABSTRACT

A display apparatus provides a reduction in the off-current of a switching thin-film transistor and an increase in the on-current of a current thin-film transistor in a current-drive thin-film transistor display apparatus. The switching thin-film transistor is formed as a transistor of LDD structure or offset structure while the current thin-film transistor is formed as a transistor of self-alignment structure. Alternatively, each of the switching thin-film transistor and the current thin-film transistor is formed as a transistor of LDD structure or offset structure, and the LDD length or offset length of the switching thin-film transistor is increased relative to that of the current thin-film transistor.

15 Claims, 10 Drawing Sheets

DISPLAY DEVICE

BACKGROUND OF THE INVENTION

1. Field of the Invention

The present invention relates to a display apparatus in which a current light-emitting element is driven with a thin-film transistor (current-drive thin-film transistor display apparatus).

2. Description of the Related Art

A number of thin-film transistor display apparatuses of various types for realizing lightness in weight, smallness in size, high image qualities and high resolution have been used. Thin-film transistor display apparatuses hitherto developed, as represented by thin-film transistor liquid crystal displays, are mainly for transmission of signal voltages or transfer of minute charges. However, it is anticipated that an element capable of current driving and having a memory function will become indispensable to self-light-emitting type panels, such as EL (electroluminescence) displays, heat-developing panels and the like which are expected to be developed in future.

FIGS. 10(a) and 10(b) are an equivalent circuit diagram and a potential relationship diagram, respectively, of a current-drive thin film transistor display apparatus, in which an organic fluorescent material is used as a light emitting material.

In FIG. 10(a), symbol 121 represents a scanning line; symbol 122, a signal line, symbol 123, a common current supply line; symbol 131, a switching thin-film transistor; symbol 132, a current thin-film transistor; symbol 151, a holding capacitor; symbol 152, a pixel electrode; symbol 164, an organic fluorescent material; and symbol 165, an opposed electrode. In FIG. 10(b), line 421 represents a scanning potential; line 422, a signal potential; line 423, a common potential; line 451, a held potential; line 452, a pixel potential; and line 465, a counter potential.

The switching thin-film transistor 131 is a transistor for controlling conduction between the signal line 122 and holding capacitor 151 by a potential on the scanning line 122. That is, signal potential 422 is transmitted to held potential 451 by scanning potential 421. With respect to a displaying pixel, signal potential 422 becomes high and held potential 451 becomes high. With respect to a non-displaying pixel, signal potential 422 becomes low and held potential 451 becomes low.

On the other hand, the current thin-film transistor 132 is a transistor for controlling conduction between the common current supply line 123 and the pixel electrode 152 by the potential on the holding capacitor 151. That is, common potential 423 is transmitted to pixel potential 452 by held potential 451. With respect to a displaying pixel, conduction is effected between the common current supply line 123 and the pixel electrode 152. With respect to a non-displaying pixel, the common current supply line 123 and the pixel electrode 152 are shut off from each other.

Consequently, a current is caused to flow between the pixel electrode 152 and the opposed electrode 165 with respect to a displaying pixel, thereby causing the organic fluorescent material 164 to emit light. With respect to a non-displaying pixel, no current flows and emission of light is not caused.

Thus, the current-drive thin film transistor display apparatus has the switching thin film transistor 131 and the current thin-film transistor 132, each of which is a field effect type transistor manufactured by an ordinary semiconductor manufacturing process. As such, for the two thin-film transistors for conventional current-drive thin film transistor display apparatuses, thin-film transistors of the same structure have been used because the manufacturing cost can be reduced if the two transistors are made in accordance with the same specifications.

Actually, even if the structures of the two thin-film transistors are the same, the current-drive thin-film transistor display apparatus has no serious defect relating to it. However, if a high-quality product is aimed at, it is preferable to construct the above-described two thin-film transistors in such a manner that importance is attached to making the characteristics of the two transistors different from each other.

That is, with respect to switching thin-film transistor 131, a reduction in off-current is needed for the purpose of enabling the charge to be retained more reliably in the holding capacitor 151. In contrast, with respect to current thin-film transistor 132, an increase in on-current is needed for the purpose of increasing the luminance of emission of light from the organic fluorescent material 164.

However, no technical idea of positively making the characteristics of the above-described two thin-film transistors different from each other in a current-drive thin-film transistor display apparatus has been conceived.

SUMMARY OF THE INVENTION

The present invention has been achieved based on such a knowledge, and an object of the present invention is to provide a current-drive thin-film transistor display apparatus in which a reduction in the off-current of switching thin-film transistor 131 and an increase in the on-current of current thin-film transistor 132 are achieved simultaneously.

To achieve the above-described object, according to an aspect of the invention, in a display apparatus in which a plurality of scanning lines, a plurality of signal lines, and a plurality of common current supply lines are formed, a switching thin-film transistor, a current thin-film transistor, a holding capacitor and a pixel electrode being formed at each of the intersections of the scanning lines and the signal lines, the switching thin-film transistor controlling conduction between the signal line and the holding capacitor by a potential on the scanning line, the current thin-film transistor controlling conduction between the common current supply line and the pixel electrode by a potential on the holding capacitor, the switching thin-film transistor is designed in such a manner that importance is attached to reducing the off-current, and the current thin-film transistor is designed in such a manner that importance is attached to increasing the on-current.

According to another aspect of the invention, each of the switching thin-film transistor and the current thin-film transistor is constructed according to required performance of the transistor in such a manner that importance is attached to reducing the off-current or increasing the on-current, so that charge can be retained more reliably in the holding capacitor, and so that a sufficient current supply to the pixel electrode can be effected more reliably.

To achieve the above-described object, according to another aspect of the invention, in a display apparatus in which a plurality of scanning lines, a plurality of signal lines, and a plurality of common current supply lines are formed, a switching thin-film transistor, a current thin-film transistor, a holding capacitor and a pixel electrode being formed at each of the intersections of the scanning lines and the signal lines, the switching thin-film transistor controlling conduction between the signal line and the holding capacitor by a potential on the scanning line, the current thin-film transistor controlling conduction between the common current supply line and the pixel electrode by a potential on the holding capacitor, a low concentration impurity region is formed between a channel region and a high concentration impurity region of the switching thin-film transistor, and a channel region and a high concentration impurity region of the current thin-film transistor are directly connected to each other.

That is, in the invention set forth in claim 2, the switching thin-film transistor is formed as a transistor of Lightly Doped Drain (LDD) structure while the current thin-film transistor is formed as a transistor of self-alignment structure.

According to another aspect of the invention, the switching thin-film transistor is designed so as to reduce the off-current while the current thin-film transistor is designed so as to increase the on-current, so that charge can be retained more reliably in the holding capacitor, and so that a sufficient current supply to the pixel electrode can be effected more reliably.

To achieve the above-described object, according to another aspect of the invention, in a display apparatus in which a plurality of scanning lines, a plurality of signal lines, and a plurality of common current supply lines are formed, a switching thin-film transistor, a current thin-film transistor, a holding capacitor and a pixel electrode being formed at each of the intersections of the scanning lines and the signal lines, the switching thin-film transistor controlling conduction between the signal line and the holding capacitor by a potential on the scanning line, the current thin-film transistor controlling conduction between the common current supply line and the pixel electrode by a potential on the holding capacitor, a low concentration impurity region is formed between a channel region and a high concentration impurity region of each of the switching thin-film transistor and the current thin-film transistor, and the length of the low concentration impurity region of the switching thin-film transistor is increased relative to the length of the low concentration impurity region of the current thin-film transistor.

That is, each of the switching thin-film transistor and the current thin-film transistor is formed as a transistor of LDD structure, and the length of the low concentration impurity region (LDD length) of the switching thin-film transistor is increased relative to the LDD length of the current thin-film transistor.

To achieve the above-described object, according to another aspect of the invention, in a display apparatus in which a plurality of scanning lines, a plurality of signal lines, and a plurality of common current supply lines are formed, a switching thin-film transistor, a current thin-film transistor, a holding capacitor and a pixel electrode being formed at each of the intersections of the scanning lines and the signal lines, the switching thin-film transistor controlling conduction between the signal line and the holding capacitor by a potential on the scanning line, the current thin-film transistor controlling conduction between the common current supply line and the pixel electrode by a potential on the holding capacitor, a region having an impurity concentration substantially the same as that of a channel region of the switching thin-film transistor is formed between the channel region and a high concentration impurity region of the switching thin-film transistor, and a channel region and a high concentration impurity region of the current thin-film transistor are directly connected to each other.

That is, the switching thin-film transistor is formed as a transistor of offset structure while the current thin-film transistor is formed as a transistor of self-alignment structure.

According to another aspect of the invention, the switching thin-film transistor is designed so as to reduce the off-current while the current thin-film transistor is designed so as to increase the on-current, so that charge can be retained more reliably in the holding capacitor, and so that a sufficient current supply to the pixel electrode can be effected more reliably.

To achieve the above-described object, according to another aspect of the invention, in a display apparatus in which a plurality of scanning lines, a plurality of signal lines, and a plurality of common current supply lines are formed, a switching thin-film transistor, a current thin-film transistor, a holding capacitor and a pixel electrode being formed at each of the intersections of the scanning lines and the signal lines, the switching thin-film transistor controlling conduction between the signal line and the holding capacitor by a potential on the scanning line, the current thin-film transistor controlling conduction between the common current supply line and the pixel electrode by a potential on the holding capacitor, a region having a certain impurity concentration is formed between a channel region and a high concentration impurity region of each of the switching thin-film transistor and the current thin-film transistor, the impurity concentration of the region between the channel region and the high concentration impurity region being substantially the same as that of the channel region, and the length of the region having an impurity concentration substantially the same as that of the channel region of the switching thin-film transistor is increased relative to the length of the region having an impurity concentration substantially the same as that of the channel region of the current thin-film transistor.

That is, each of the switching thin-film transistor and the current thin-film transistor is formed as a transistor of offset structure, and the offset length of the switching thin-film transistor is increased relative to the offset length of the current thin-film transistor.

According to another aspect of the invention the holding capacitor is formed by using a gate insulating film between the scanning line and the channel region of the switching thin-film transistor or the current thin-film transistor.

According to another aspect of the invention, a thin gate insulating film is used for the holding capacitor to enable the holding capacitor to be formed as a small-area large-capacity capacitor.

In contrast, in the display apparatus according to another aspect of the invention, the holding capacitor is formed by using an interlevel insulating film between the scanning line and the signal line.

According to another aspect of the invention, an interlevel insulating film is used for the holding capacitor to improve the degree of freedom of designing.

DETAILED DESCRIPTION OF THE PREFERRED EMBODIMENTS

Preferred embodiments of the present invention will be described below with reference to the drawings.

(1) First Embodiment

FIGS. 1 to 4 are diagrams showing a first embodiment of the present invention. In this embodiment, a display apparatus in accordance with the present invention is applied to an active matrix type display apparatus using EL display elements.

Figure 1:
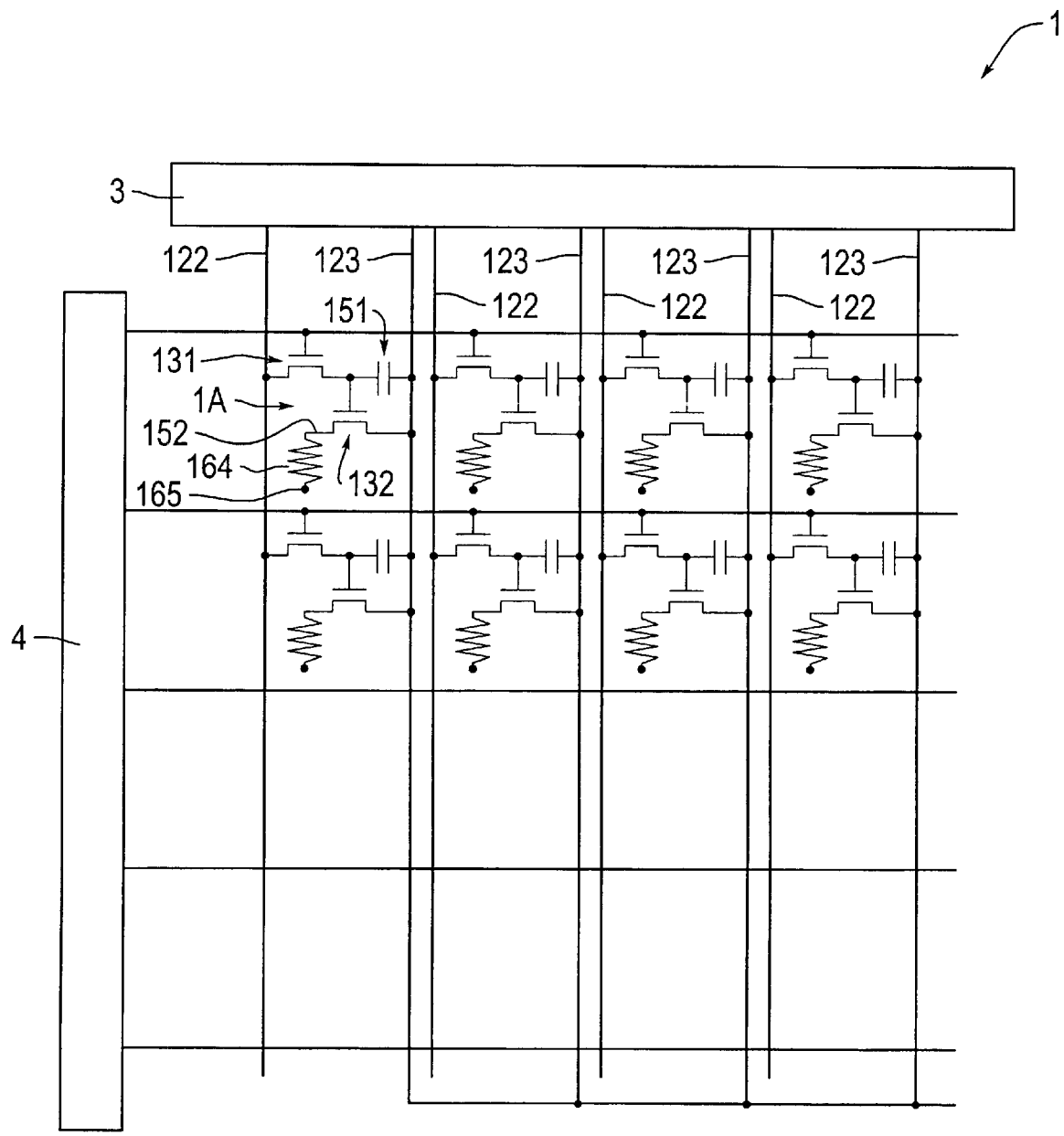
FIG. 1 is a circuit diagram showing a portion of a display apparatus which represents a first embodiment of the present invention.

FIG. 1 is a circuit diagram showing a portion of a display apparatus 1 in this embodiment. The display apparatus 1 is constructed in such a manner that a plurality of scanning lines 121, a plurality of signal lines 122, and a plurality of common current supply lines 123 are formed on a transparent display substrate, the signal lines 122 extending perpendicularly to the scanning lines 121, the common current supply lines 123 extending parallel to the signal lines 122. A pixel region unit 1A is provided at each of the intersections of the scanning lines 121 and the signal lines 122.

A data-side drive circuit 3 having a shift register, a level shifter, video lines, and analog switches is provided in connection with the signal lines 122. A scanning-side drive circuit 4 having a shift register and a level shifter is provided in connection with the scanning lines 121. In each pixel region 1A are provided a switching thin-film transistor 131 having a gate electrode to which a scanning signal is supplied via the scanning line 121, a holding capacitor 151 for holding an image signal supplied from the signal line 132 via the switching thin-film transistor 131, a current thin-film transistor 132 having a gate electrode to which the image signal held by the holding capacitor 151 is supplied, a pixel electrode 152 into which a drive current from the common current supply line 123 flows when the pixel electrode 152 is connected to the common current supply lines 123 by the current thin-film transistor 132, and an organic fluorescent material 164 interposed between the pixel electrode 152 and an opposed electrode 165.

Figure 2A:
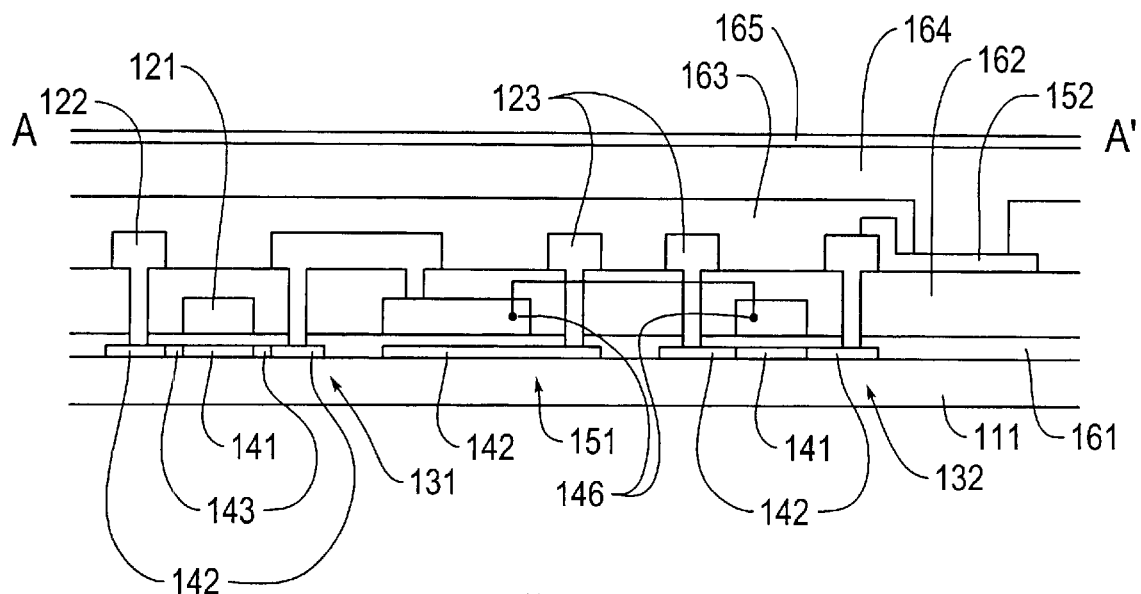
FIGS. 2(a) and 2(b) comprise a cross-sectional view (a) and a plan view of the display apparatus in the first embodiment.
Figure 2B:
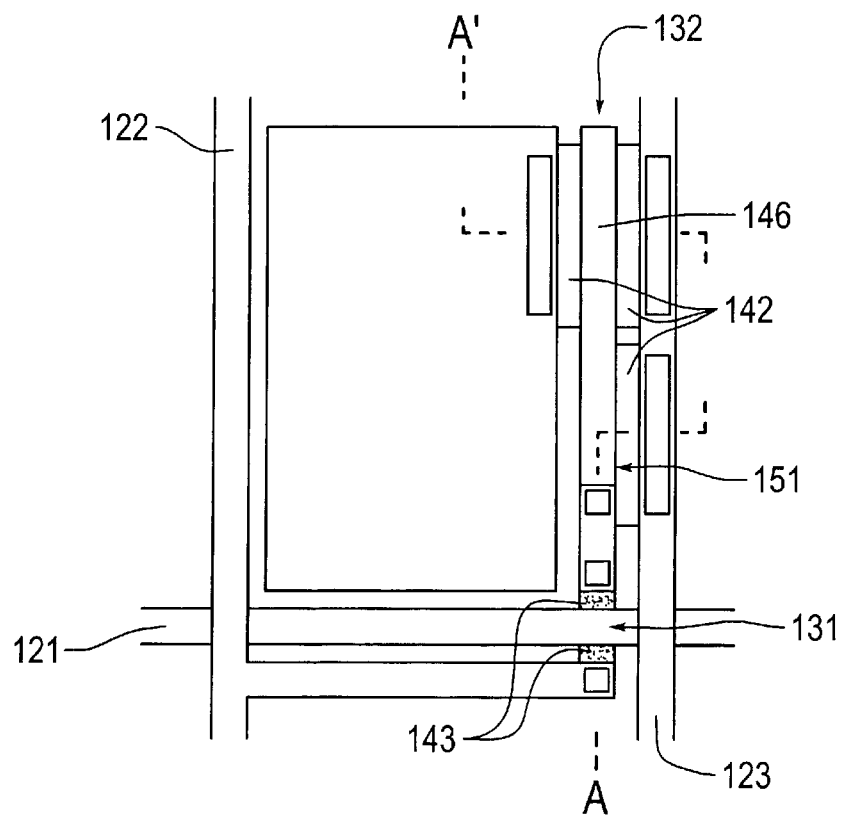

FIGS. 2(a) and 2(b) are a cross-sectional view and a plan view, respectively, of each pixel region 1A shown in FIG. 1. Cross-sectional view 2(a) is taken along line A–A' of plan view 2(b). In FIGS. 2(a) and 2(b), an element 141 represents a channel region; an element 142, a high concentration impurity region; an element 143, a low concentration impurity region; an element 146, a relay wiring; an element 161, a gate insulating film; an element 162, an interlevel insulating film; and an element 163, an uppermost insulating film.

FIGS. 3(a), 3(b), 3(c), 3(d), and 3(e) are cross-sectional views showing the process of manufacturing the display apparatus 1 and correspond to the A–A' cross sectional view of FIG. 2(b). In FIGS. 3(a)–3(e), an element 211 represents a resist mask, arrows 221 represent high concentration impurity doping, and arrows 222 represent low concentration impurity doping.

The manufacturing process is described below in detail.

Figure 3A:
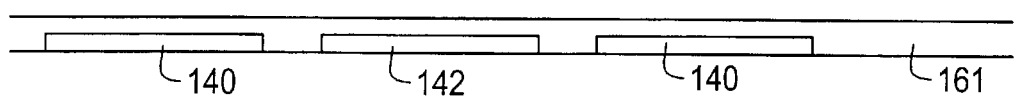
FIGS. 3(a)–3(e) are diagrams showing the process of manufacturing the display apparatus in the first embodiment.

First, as shown in FIG. 3(a), a semiconductor film is formed, on which channel regions 141 and source and drain regions of switching thin-film transistor 131 and current thin-film transistor 132, and one electrode of holding capacitor 151 are formed as described below. This semiconductor film is patterned into semiconductor film lands 140. A gate insulating film 161 is formed so as to cover the semiconductor pattern lands 140.

Figure 3B:
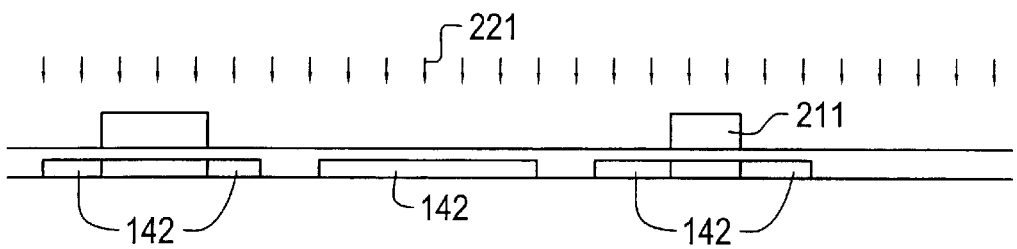

Next, as shown in FIG. 3(b), a film for forming resist masks 211 is formed and patterned. At this time, resist mask 211 at a position where switching thin-film transistor 131 (left resist mask 211 as viewed in FIG. 3(b)) is formed so that its width is slightly larger than the length of the channel region. Thereafter, high concentration impurity doping 221 is performed to form high concentration impurity regions 142.

Figure 3C:
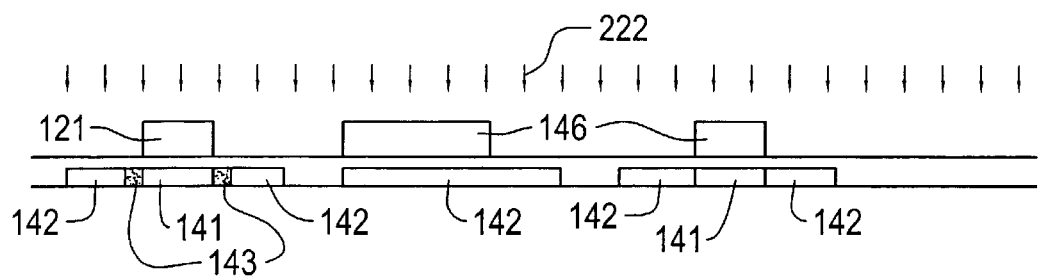

Next, as shown in FIG. 3(c), a metal film is formed and patterned to form scanning line 121 and relay wiring 146. Thereafter, low concentration impurity doping 222 is performed with scanning line 121 and relay wiring 146 used as a mask. Low concentration impurity regions 143 are thereby formed below scanning line 121 and inside high concentration impurity regions 142 since the width of scanning line 121 is equal to the length of the channel region. Channel region 141 is defined inside the low concentration impurity regions 143.

Thus, switching thin-film transistor 131 of LDD structure and current thin-film transistor 132 of self-alignment structure are formed.

Figure 3D:
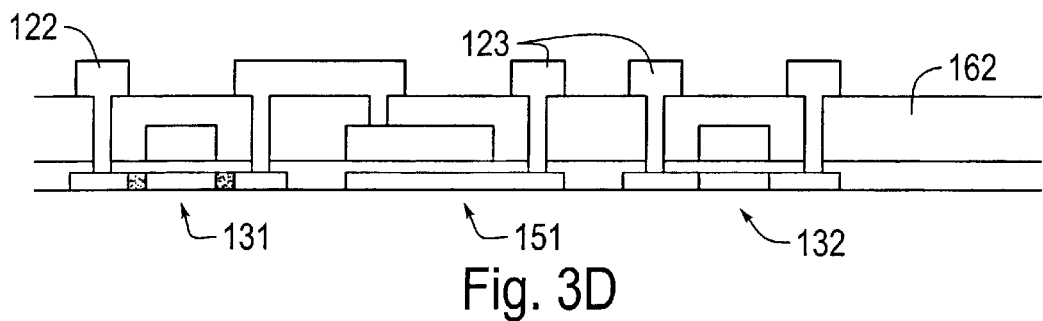

Thereafter, as shown in FIG. 3(d), interlevel insulating film 162 is formed, a contact hole is formed, and a metal film is formed and patterned, thereby forming signal line 122 and common current supply line 123.

Figure 3E:
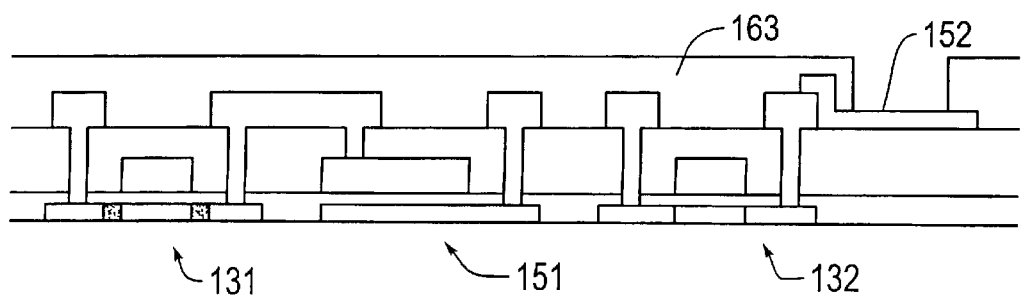

Next, as shown in FIG. 3(e), pixel electrode 152 is formed and uppermost insulating film 163 is formed. Thereafter, organic fluorescent material 164 and opposed electrode 165 are formed (not shown).

Figure 4:
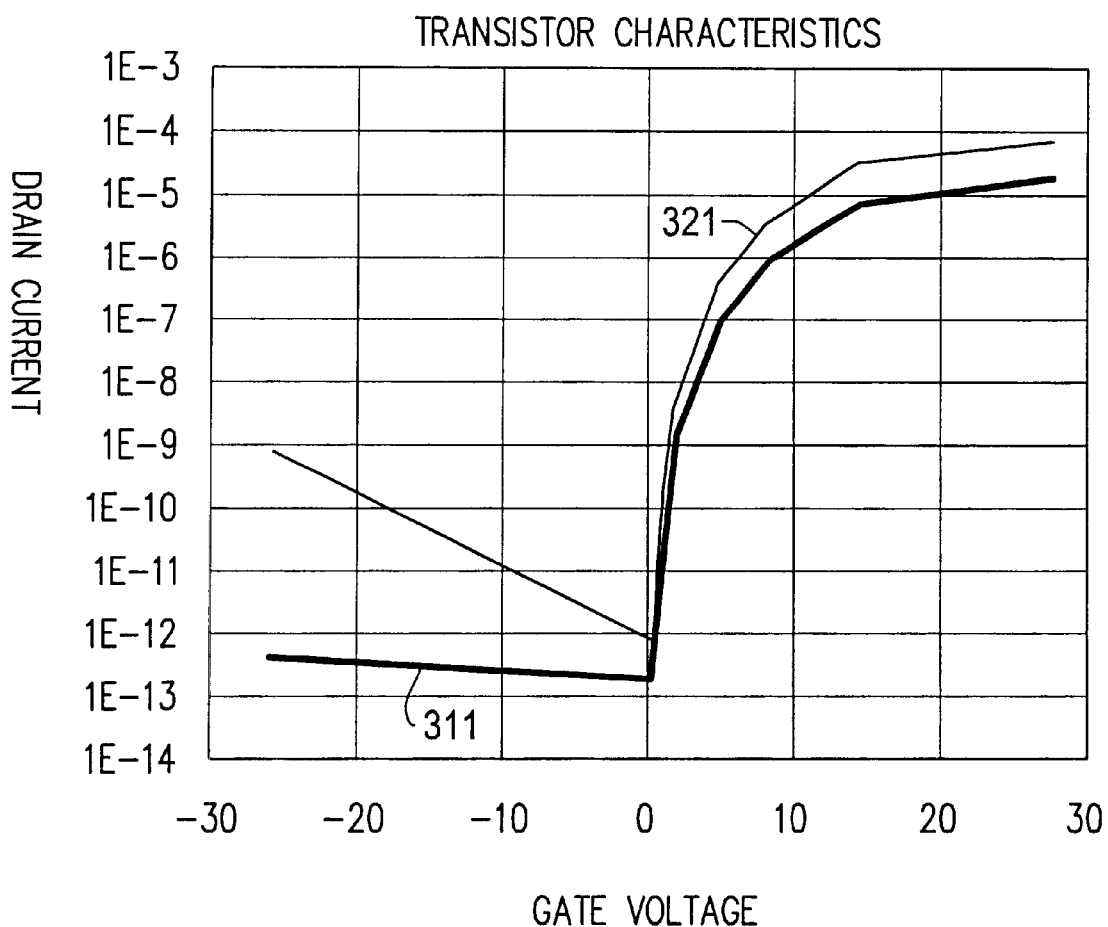
FIG. 4 is a diagram showing characteristics of thin-film transistors in the first embodiment.

FIG. 4 is a diagram showing a characteristic of each of switching thin-film transistor 131 and current thin-film transistor 132 in the first embodiment. In FIG. 4, line 311 indicates a characteristic of switching thin-film transistor 131 of LDD structure, and line 321 indicates a characteristic of current thin-film transistor 132 of self-alignment structure. As can be understood from FIG. 4, switching thin-film transistor 131 has a smaller off-current while current thin-film transistor 132 has a larger on-current.

That is, in the display apparatus 1 of this embodiment, a reduction in the off-current of switching thin-film transistor 131 and an increase in the on-current of current thin-film transistor 312 are simultaneously achieved. As a result, a charge can be reliably retained in holding capacitor 151 and a sufficient current supply to pixel electrode 162 can be effected more reliably.

In this embodiment, holding capacitor 151 is formed by using gate insulating film 161. In general, gate insulating film 161 is formed so as to be thinner than other insulating films. Therefore, the use of gate insulating film 161 has the advantage that small-area large-capacity holding capacitor 151 can be formed.

The structure of the thin-film transistor display apparatus, the method of manufacturing the apparatus and materials of the apparatus can be freely selected as long as they accord with the idea of the present invention.

(2) Second Embodiment

Figure 5A:
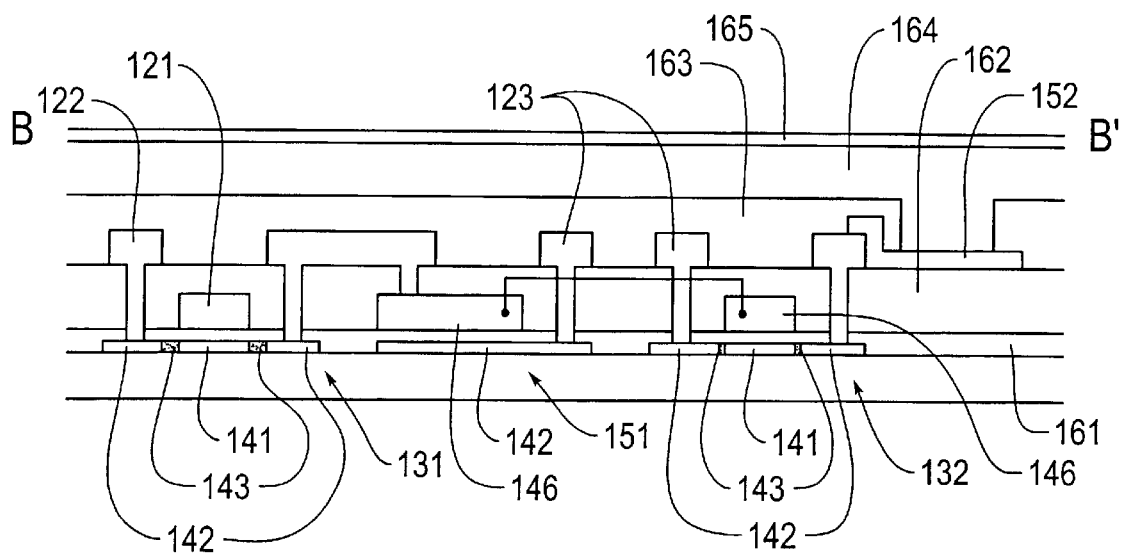
FIGS. 5(a) and 5(b) comprise a cross-sectional view (a) and a plan view of a display apparatus which represents a second embodiment of the present invention.
Figure 5B:
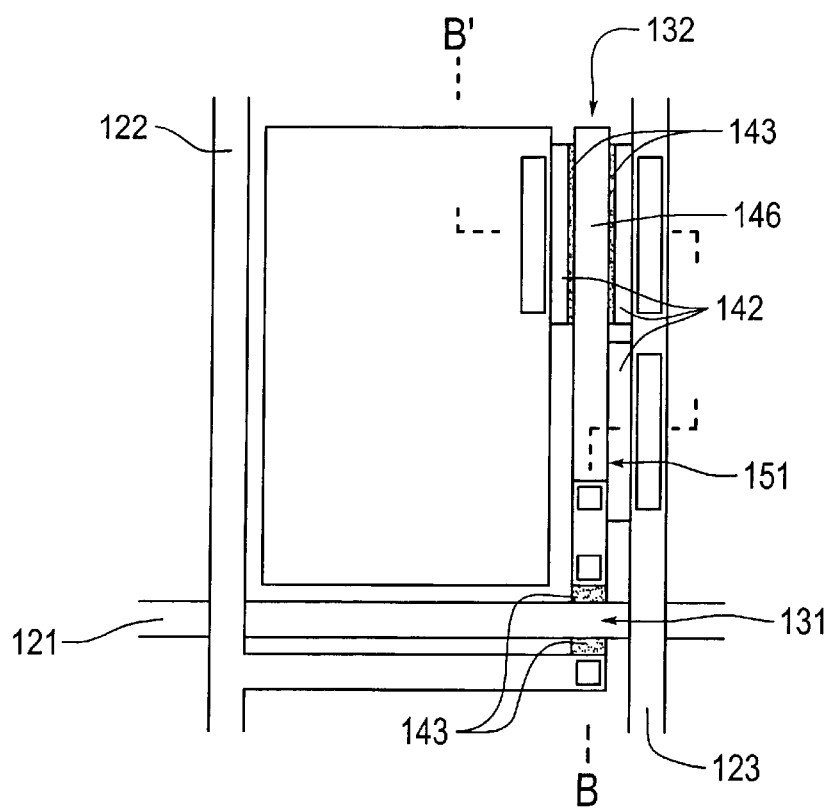

FIGS. 5(a) and 5(b) show a second embodiment of the present invention and comprise a cross-sectional view and a plan view showing the structure of a display region 1A, which correspond to those in FIGS. 2(a) and 2(b) comprise. Cross-sectional view 5(a) is taken along line B–B' of plan view 5(b). The same components as those in the first embodiment are indicated by the same reference numerals and the description of them will not be repeated.

That is, in this embodiment, each of switching thin-film transistor 131 and current thin-film transistor 132 is of LDD structure. However, the LDD length of switching thin-film transistor 131 is larger than the LDD length of current thin-film transistor 132.

This construction also makes it possible to simultaneously achieve a reduction in the off-current of switching thin-film transistor 131 and an increase in the on-current of current thin-film transistor 132, as in the above-described first embodiment.

(3) Third Embodiment

Figure 7A:
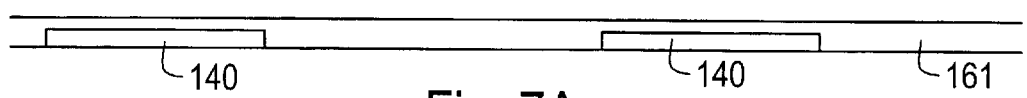
FIGS. 7(a)–7(e) are diagrams showing the process of manufacturing the display apparatus in the third embodiment.
Figure 7B:
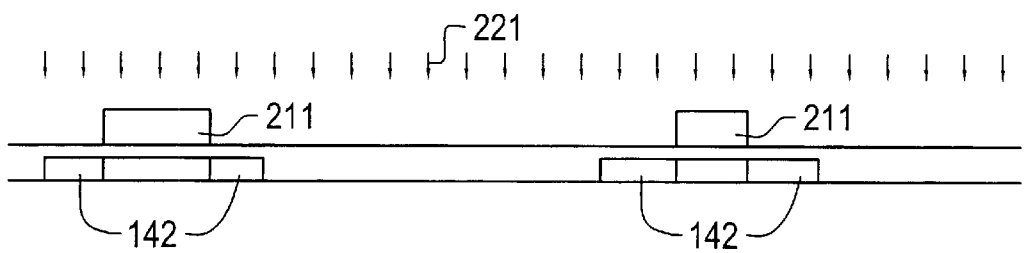
Figure 7C:
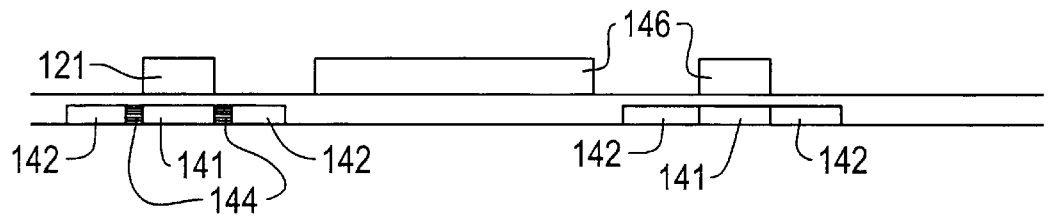
Figure 7D:
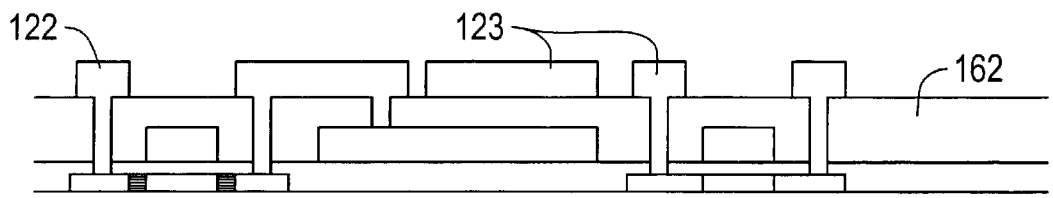
Figure 7E:
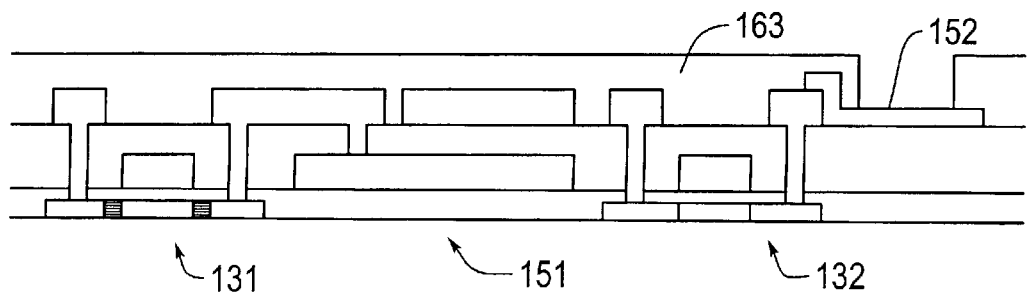
Figure 8:
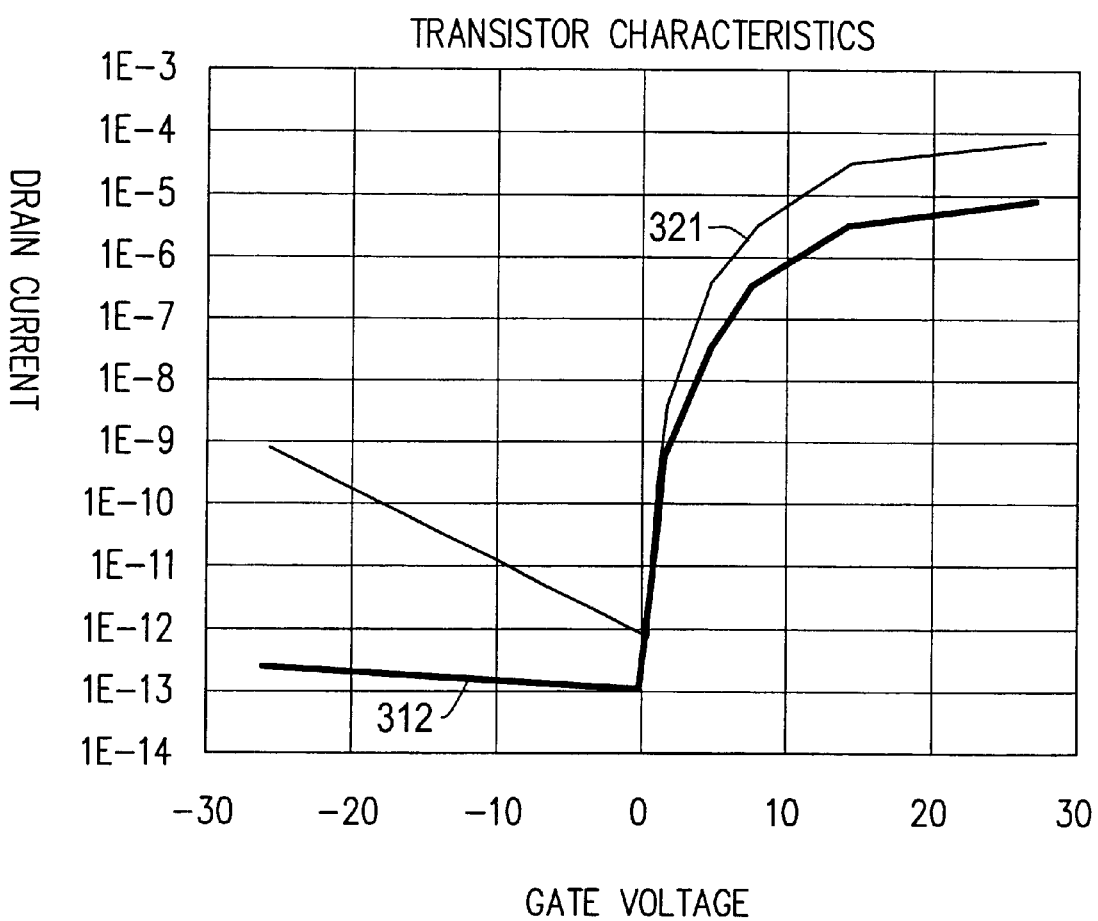
FIG. 8 is a diagram showing characteristics of thin-film transistors in the third embodiment.

FIGS. 6 to 8 are diagrams showing a third embodiment of the present invention. In this embodiment, a thin-film transistor display apparatus in accordance with the present invention is also applied to an active matrix type display apparatus using EL display elements, as is that in the first embodiment. The entire construction of this embodiment is the same as that of the first embodiment shown in FIG. 1. Therefore, the illustration and description of it will not be repeated. Also, the same components as those in the first embodiment are indicated by the same reference numerals, and the description of them will not be repeated.

Figure 6A:
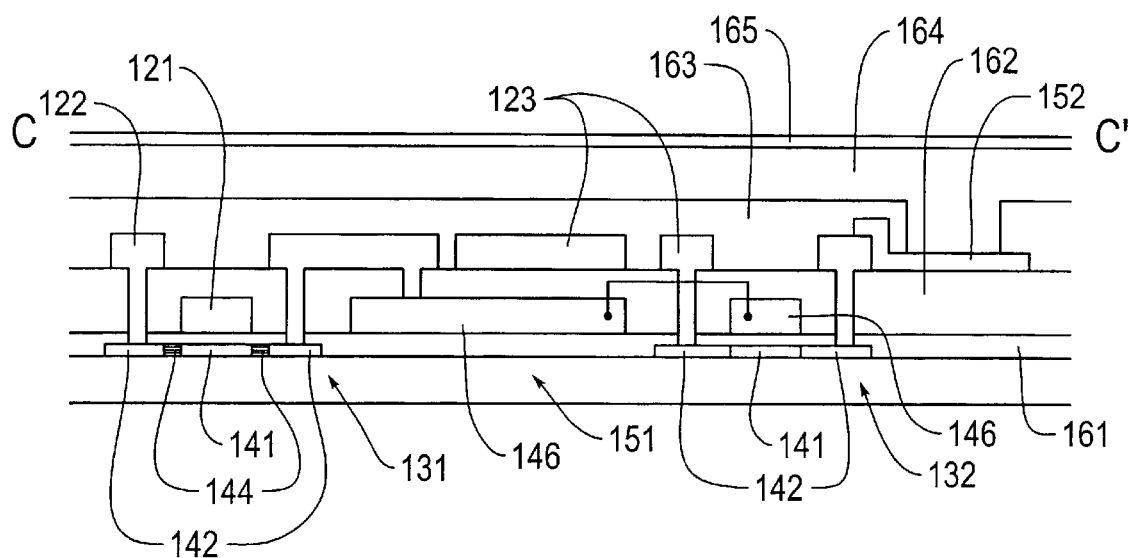
FIGS. 6(a) and 6(b) comprise a cross-sectional view (a) and a plan view of a display apparatus which represents a third embodiment of the present invention.
Figure 6B:
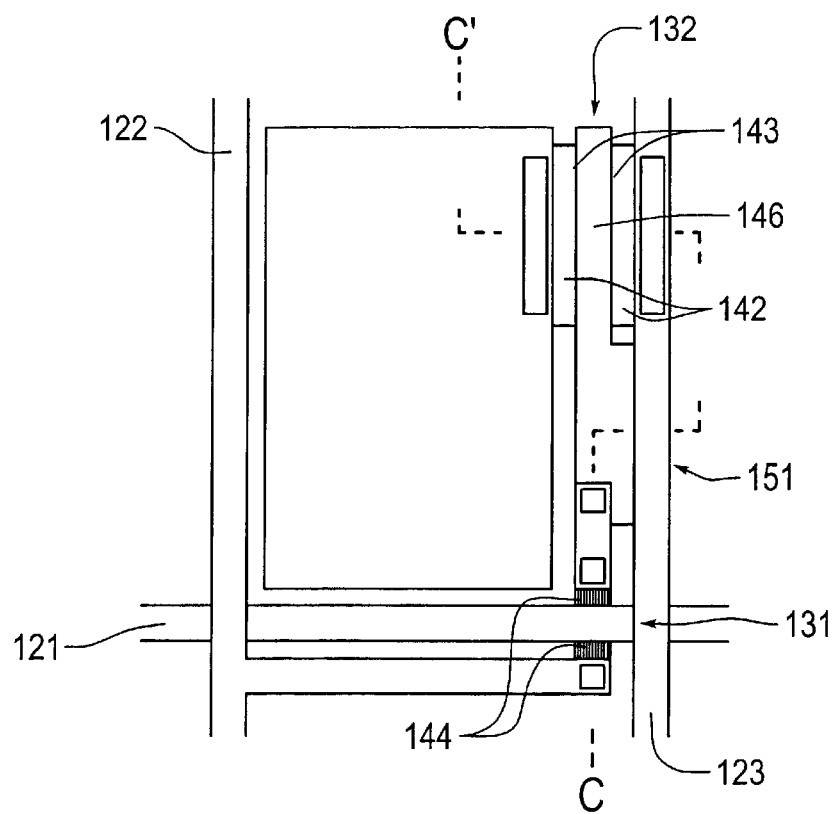

FIGS. 6(a) and 6(b) comprise a cross-sectional view and a plan view showing the structure of a display region 1A, which correspond to those in FIGS. 2(a) and 2(b) comprise. Cross-sectional view 6(a) is taken along line C–C' of plan view 6(b). Portions 144 represent regions having an impurity concentration substantially the same as that in the channel region.

FIGS. 7(a) to 7(e) are cross-sectional views showing the process of manufacturing the display apparatus 1 of this embodiment. The manufacturing process shown in these figures is substantially the same as that in the first embodiment, and differs in that low concentration impurity doping 222 for forming low impurity regions 143 is not performed.

That is, as shown in FIG. 7(c), a metal film is formed and patterned to form scanning line 121 and relay wiring 146, thus completing switching thin-film transistor 131 and current thin-film transistor 132. Since regions 144 having an impurity concentration substantially the same as that of channel region 141 are formed between high concentration impurity regions 142 and channel region 141 in switching thin-film transistor 131, the thus-formed switching thin-film transistor 131 is a transistor of offset structure.

FIG. 8 is a diagram showing a characteristic of each of switching thin-film transistor 131 and current thin-film transistor 132 in this embodiment. In FIG. 8, line 312 indicates a characteristic of switching thin-film transistor 131 of offset structure, and a line 321 indicates a characteristic of current thin-film transistor 132 of self-alignment structure. As can be understood from FIG. 8, switching thin-film transistor 131 has a smaller off-current while current thin-film transistor 132 has a larger on-current.

That is, also in the display apparatus 1 of this embodiment, a reduction in the off-current of switching thin-film transistor 131 and an increase in the on-current of current thin-film transistor 132 are simultaneously achieved. As a result, a charge can be reliably retained in holding capacitor 151 and a sufficient current supply to pixel electrode 162 can be effected more reliably.

In this embodiment, holding capacitor 151 is formed by using interlevel insulating film 162. Therefore, scanning line 121 and signal line 122 can form holding capacitor 151 without high concentration impurity region 142, thus improving the degree of freedom of designing.

(4) Fourth Embodiment

Figure 9A:
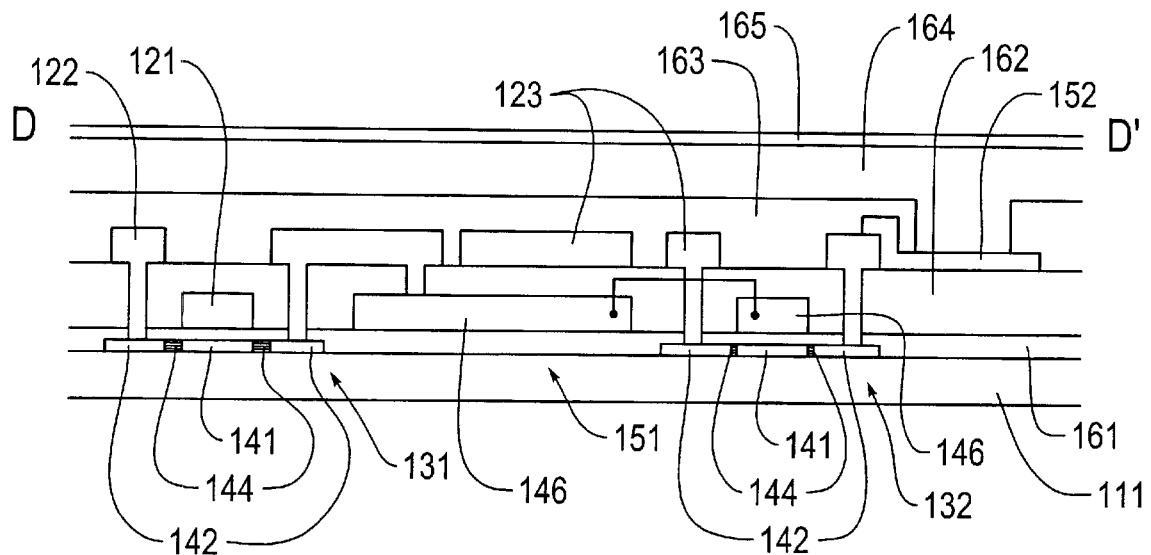
FIGS. 9(a) and 9(b) comprise a cross-sectional view (a) and a plan view of a display apparatus which represents a fourth embodiment of the present invention.
Figure 9B:
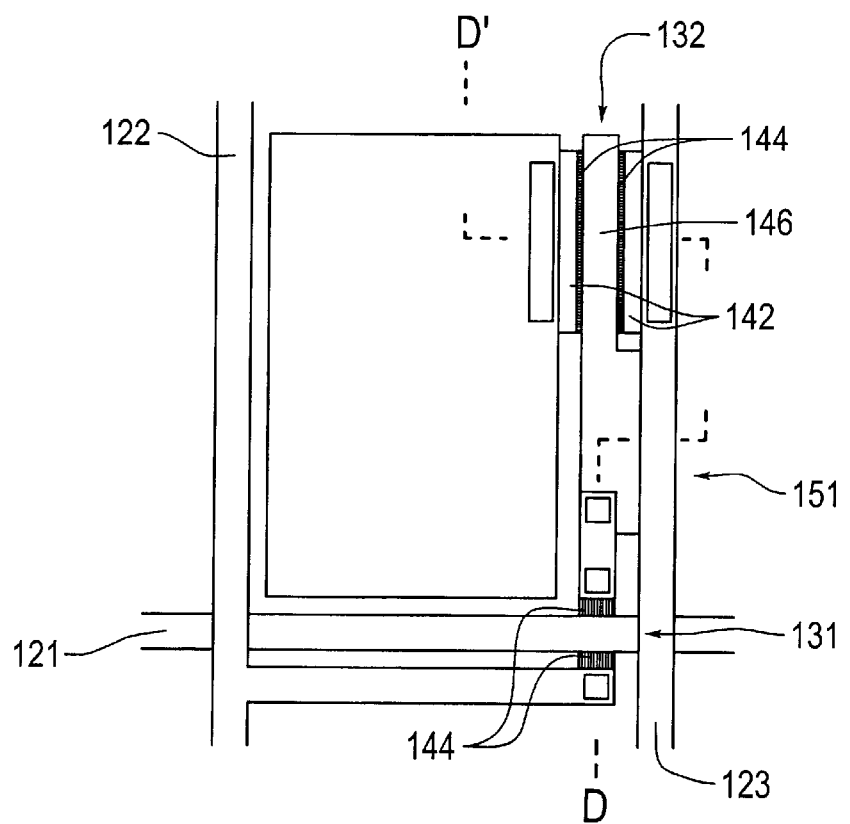
Figure 10A:
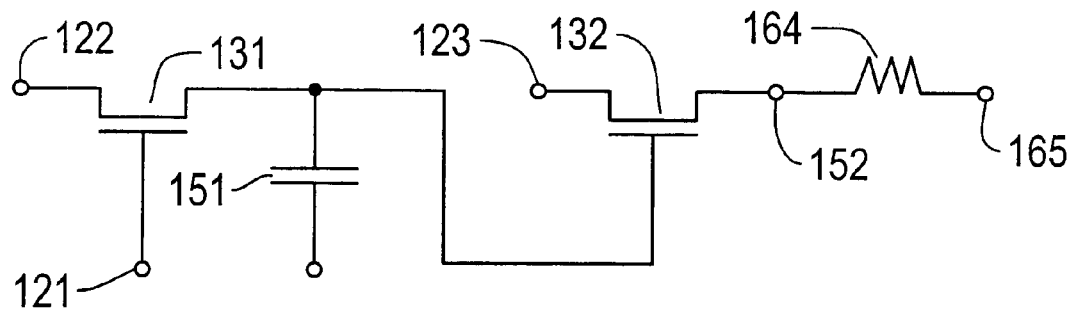
FIGS. 10(a) and 10(b) comprise an equivalent circuit diagram and a potential relationship diagram of a current-drive thin-film transistor display apparatus.
Figure 10B:
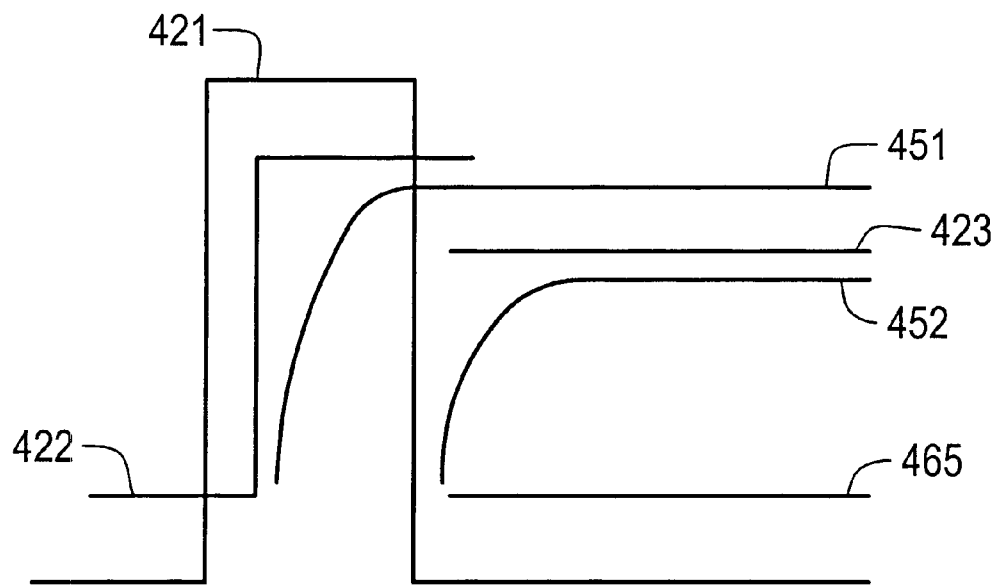

FIGS. 9(a) and 9(b) show a fourth embodiment of the present invention and comprise a cross-sectional view and a plan view showing the structure of a display region 1A, which correspond to those in FIGS. 2(a) and 2(b). Cross-sectional view 9(a) is taken along line D–D' of plan view 9(b). The same components as those in the above-described embodiments are indicated by the same reference numerals and the description of them will not be repeated.

That is, in this embodiment, each of switching thin-film transistor 131 and current thin-film transistor 132 is of offset structure. However, the offset length of switching thin-film transistor 131 is larger than the offset length of current thin-film transistor 132.

This construction also makes it possible to simultaneously achieve a reduction in the off-current of switching thin-film transistor 131 and an increase in the on-current of current thin-film transistor 132, as in the above-described third embodiment.

INDUSTRIAL APPLICABILITY

As described above, according to the present invention, a reduction in the off-current of the switching thin-film transistor 131 and an increase in the on-current of the current thin-film transistor can be achieved simultaneously, thereby ensuring that charge can be reliably retained in the holding capacitor, and that a sufficient current supply to the pixel electrode can be effected more reliably.

What is claimed is:

1. A display apparatus comprising:
   a scanning line;
   a signal line;
   a common current supply line;
   a hold capacitor;
   a pixel electrode;
   a current light-emitting element;
   a switching thin-film transistor connected between said signal line and said hold capacitor; and
   a current thin-film transistor connected between said common current supply line and said pixel electrode, wherein an off-current of said switching thin-film transistor is smaller than that of said current thin-film transistor to retain a charge on the hold capacitor, and an on-current of said current thin-film transistor is larger than that of said switching thin-film transistor to supply current to the current light emitting element.

2. A display apparatus including a scanning line, a signal line, a common current supply line, a hold capacitor and a pixel electrode comprising: a switching thin-film transistor connected between said signal line and said hold capacitor, a current thin-film transistor connected between said common current supply line and said pixel electrode,
   a low concentration impurity region formed between a channel region and a high concentration impurity region of said switching thin-film transistor, and a channel region directly connected to a high concentration impurity region of said current thin-film transistor.

3. A display apparatus including a scanning line, a signal line, a common current supply line, a hold capacitor and a pixel electrode comprising: a switching thin-film transistor connected between said signal line and said hold capacitor, a current thin-film transistor connected between said common current supply line and said pixel electrode, a low concentration impurity region formed between a channel region and a high concentration impurity region of each of said switching thin-film transistor and said current thin-film transistor, and a length of the low concentration impurity region of said switching thin-film transistor is larger than a length of the low concentration impurity region of said current thin-film transistor.

4. A display apparatus including a scanning line, a signal line, a common current supply line, a hold capacitor and a pixel electrode comprising: a switching thin-film transistor connected between said signal line and said hold capacitor, a current thin-film transistor connected between said common current supply line and said pixel electrode, a region having an impurity concentration substantially the same as that of a first channel region formed between the first channel region and a high concentration impurity region of said switching thin-film transistor, a second channel region directly connected to a high concentration impurity region of said current thin-film transistor.

5. A display apparatus including a scanning line, a signal line, a common current supply line, a hold capacitor and a pixel electrode comprising: a switching thin-film transistor connected between said signal line and said hold capacitor, a current thin-film transistor connected between said common current supply line and said pixel electrode, a region having an impurity concentration substantially the same as that of a channel region formed between the channel region and a high concentration impurity region of each of said switching thin-film transistor and said current thin-film transistor, a length of the region having an impurity concentration substantially the same as that of the channel region of said switching thin-film transistor is larger than a length of the region having an impurity concentration substantially the same as that of the channel region of said current thin-film transistor.

6. The display apparatus according to claim 1, wherein said hold capacitor is formed by using a gate insulating film between said scanning line and the channel region of said switching thin-film transistor or said current thin-film transistor.

7. The display apparatus according to claim 1, wherein said hold capacitor is formed by using an interlayer insulating film between said scanning line and said signal line.

8. The display apparatus according to claim 2, wherein said hold capacitor is formed by using a gate insulating film between said scanning line and the channel region of said switching thin-film transistor or said current thin-film transistor.

9. The display apparatus according to claim 2, wherein said hold capacitor is formed by using an interlayer insulating film between said scanning line and said signal line.

10. The display apparatus according to claim 3, wherein said hold capacitor is formed by using a gate insulating film between said scanning line and the channel region of said switching thin-film transistor or said current thin-film transistor.

11. The display apparatus according to claim 3, wherein said hold capacitor is formed by using an interlayer insulating film between said scanning line and said signal line.

12. The display apparatus according to claim 4, wherein said hold capacitor is formed by using a gate insulating film between said scanning line and the channel region of said switching thin-film transistor or said current thin-film transistor.

13. The display apparatus according to claim 4, wherein said hold capacitor is formed by using an interlayer insulating film between said scanning line and said signal line.

14. The display apparatus according to claim 5, wherein said hold capacitor is formed by using a gate insulating film between said scanning line and the channel region of said switching thin-film transistor or said current thin-film transistor.

15. The display apparatus according to claim 5, wherein said hold capacitor is formed by using an interlayer insulating film between said scanning line and said signal line.

* * * * *